(12) United States Patent
Lim

(10) Patent No.: US 11,283,404 B1
(45) Date of Patent: Mar. 22, 2022

(54) TUNABLE OSCILLATOR WITH TEMPERATURE AND POWER VOLTAGE COMPENSATION FUNCTION

(71) Applicant: Samsung Electro-Mechanics Co., Ltd., Suwon-si (KR)

(72) Inventor: Tae Ho Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/205,051

(22) Filed: Mar. 18, 2021

(30) Foreign Application Priority Data

Dec. 17, 2020 (KR) .................. 10-2020-0177804

(51) Int. Cl.
 *H03B 5/04* (2006.01)
 *H03B 5/12* (2006.01)
(52) U.S. Cl.
 CPC ............ *H03B 5/04* (2013.01); *H03B 5/1228* (2013.01); *H03B 5/1265* (2013.01); *H03B 2200/0038* (2013.01)
(58) Field of Classification Search
 CPC ....................................................... H03B 5/04
 USPC ....................................................... 331/176
 See application file for complete search history.

(56) References Cited

U.S. PATENT DOCUMENTS

| | | | | |
|---|---|---|---|---|
| 7,843,279 | B2* | 11/2010 | Chou | H03B 5/24 331/111 |
| 8,067,992 | B2* | 11/2011 | Chen | H03K 3/0231 331/111 |
| 8,242,852 | B2* | 8/2012 | Denier | H03K 3/012 331/111 |
| 8,508,307 | B2* | 8/2013 | Mitsuda | G05F 3/30 331/176 |
| 2018/0167030 | A1 | 6/2018 | Wu et al. | |

FOREIGN PATENT DOCUMENTS

| | | |
|---|---|---|
| JP | 2010-147652 A | 7/2010 |
| KR | 10-2008-0061217 A | 7/2008 |
| KR | 10-2018-0022986 A | 3/2018 |

* cited by examiner

*Primary Examiner* — Joseph Chang
(74) *Attorney, Agent, or Firm* — NSIP Law

(57) ABSTRACT

A tunable oscillator includes a current bias circuit configured to generate a reference bias current, a variable voltage bias circuit configured to receive the reference bias current and generate a bias voltage varied based on a voltage control signal, an oscillation signal generator circuit configured to generate an oscillation signal based on the reference bias current and a switching control signal, and a switching control circuit configured to generate the switching control signal based on the bias voltage and the oscillation signal. A frequency of the oscillation signal is varied based on a magnitude of the bias voltage.

20 Claims, 8 Drawing Sheets

TUNABLE OSCILLATOR WITH TEMPERATURE AND POWER VOLTAGE COMPENSATION FUNCTION

CROSS-REFERENCE TO RELATED APPLICATION(S)

This application claims the benefit under 35 USC 119(a) of Korean Patent Application No. 10-2020-0177804 filed on Dec. 17, 2020 in the Korean Intellectual Property Office, the disclosure of which is incorporated herein by reference in its entirety.

BACKGROUND

1. Field

The present disclosure relates to a tunable oscillator with a temperature and power voltage compensation function.

2. Description of Related Art

Generally, an oscillator generates an oscillating signal having a period. The period may be determined by a voltage or a current, and when the voltage and current fluctuate according to temperature, the period of the oscillation signal may change according to fluctuations in temperature, such that the oscillation signal may become unstable.

As an example, as for a general oscillator having a band gap reference (BGR) circuit, a frequency of the oscillation signal, the period, may be T=CV/I, and the voltage V may generate a voltage and current independent of temperature due to a BGR circuit. Accordingly, an oscillation signal may be generated with a period of an oscillation signal independent of temperature.

However, since such a general oscillator has a large size and includes an expensive band gap circuit, the manufacturing costs thereof may be high and there may be a limitation in reduction of a size thereof.

In particular, a general oscillator may not change an oscillation frequency without adding a frequency variable circuit, such that an oscillation frequency may not be adjusted after manufacturing.

Also, when a frequency variable circuit is added, the manufacturing costs of the oscillator may increase, and a size of the oscillator may increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a tunable oscillator includes a current bias circuit configured to generate a reference bias current, a variable voltage bias circuit configured to receive the reference bias current and generate a bias voltage varied based on a voltage control signal, an oscillation signal generator circuit configured to generate an oscillation signal based on the reference bias current and a switching control signal, and a switching control circuit configured to generate the switching control signal based on the bias voltage and the oscillation signal. A frequency of the oscillation signal is varied based on a magnitude of the bias voltage.

The current bias circuit may include a current mirror source and a self-bias circuit. The current mirror source, connected to a power voltage terminal, may include a first PMOS and a second PMOS connected in a current mirror structure, and may be configured to generate the reference bias current. The self-bias circuit, connected to the current mirror source, may include a first NMOS and a second NMOS having a gate-common connection, and a bias resistor connected between a source of the first NMOS and a ground.

The variable voltage bias circuit may include a first current mirror and a bias voltage variable circuit. The first current mirror, including a detection PMOS connected to the current bias circuit in a current mirror structure, may be configured to generate a first bias current based on the reference bias current. The bias voltage variable circuit may be configured to receive the first bias current from the first current mirror and generate the bias voltage varied based on the voltage control signal.

The oscillation signal generator circuit may include an output current mirror and a charging and discharging circuit. The output current mirror, including an output PMOS connected to the current bias circuit in a current mirror structure, may be configured to generate a second bias current based on the reference bias current. The charging and discharging circuit, including a capacitor connected between the output PMOS and a ground, may be configured to perform charging and discharging based on a second bias current flowing through the output PMOS, and a switching device, connected in parallel to the capacitor, may be configured to generate the oscillation signal by performing a switching operation in response to the switching control signal of the switching control circuit.

The switching control circuit may include a comparison circuit configured to compare the bias voltage with the oscillation signal and output a comparison signal having a level based on a result of the comparison, and a discharging logic circuit configured to generate the switching control signal having a constant discharging time based on the comparison signal from the comparison circuit.

The bias voltage variable circuit may include a variable resistor circuit configured to receive the first bias current from the first current mirror and have a resistance value varied based on the voltage control signal. The variable resistor circuit may generate the bias voltage determined based on the first bias current and the resistance value.

The bias voltage variable circuit may include a resistor circuit and a decode. The resistor circuit, including a plurality of resistors connected in series between an output terminal of the first current mirror and a ground, may be configured to output a plurality of voltages at one end of the plurality of resistors. The decoder may be configured to output a voltage selected from among a plurality of voltages from the resistor circuit, selected based on the voltage control signal, as the bias voltage.

In another general aspect, a tunable oscillator includes a current bias circuit configured to generate a reference bias current, a variable voltage bias circuit configured to receive the reference bias current and generate a bias voltage varied and determined based on a voltage control signal, an oscillation signal generator circuit configured to generate an oscillation signal by performing charging and discharging based on the reference bias current and a switching control signal, a switching control circuit configured to generate the switching control signal based on the bias voltage and the oscillation signal, and a control circuit configured to provide the voltage control signal.

A frequency of the oscillation signal may be varied based on the magnitude of the bias voltage.

The current bias circuit may include a current mirror source and a self-bias circuit. The current mirror source, connected to a power voltage terminal, including a first PMOS and a second PMOS connected in a current mirror structure, and may be configured to generate the reference bias current. The self-bias circuit, connected to the current mirror source, may include a first NMOS and a second NMOS having a gate-common connection, and a bias resistor connected between a source of the first NMOS and a ground.

The variable voltage bias circuit may include a first current mirror and a bias voltage variable circuit. The first current mirror, including a detection PMOS connected to the current bias circuit in a current mirror structure, may be configured to generate a first bias current based on the reference bias current. The bias voltage variable circuit may be configured to receive the first bias current from the first current mirror and generate the bias voltage varied based on the voltage control signal.

The oscillation signal generator circuit may include an output current mirror and a charging and discharging circuit. The output current mirror, including an output PMOS connected to the current bias circuit in a current mirror structure, may be configured to generate a second bias current based on the reference bias current. The charging and discharging circuit, including a capacitor connected between the output PMOS and a ground, may be configured to perform charging and discharging based on a second bias current flowing through the output PMOS. The switching device. connected in parallel to the capacitor, may be configured to generate the oscillation signal by performing a switching operation in response to the switching control signal of the switching control circuit.

The switching control circuit may include a comparison circuit that may be configured to compare the bias voltage with the oscillation signal and output a comparison signal having a level based on a result of the comparison, and a discharging logic circuit that may be configured to generate the switching control signal having a constant discharging time based on the comparison signal from the comparison circuit.

The bias voltage variable circuit may include a variable resistor circuit that may be configured to receive the first bias current from the first current mirror and have a resistance value varied based on the voltage control signal. The variable resistor circuit may generate the bias voltage determined based on the first bias current and the resistance value.

The bias voltage variable circuit may include a resistor circuit and a decoder. The resistor circuit, including a plurality of resistors connected in series between an output terminal of the first current mirror and a ground, may be configured to output a plurality of voltages at one end of the plurality of resistors. The decoder outputting a voltage may be selected from among a plurality of voltages from the resistor circuit, selected based on the voltage control signal, as the bias voltage.

In another general aspect, an oscillator includes a current bias circuit, a variable voltage bias circuit, an oscillation signal generator, and a switching control circuit. The current bias circuit is configured to generate a reference bias current. The variable voltage bias circuit, includes a first current mirror, connected to the current bias circuit in a current mirror structure, configured to generate a first bias current based on the reference bias current, and a bias voltage variable circuit configured to receive the first bias current, and generate a bias voltage varied based on a voltage control signal. The oscillation signal generator circuit is configured to generate an oscillation signal based on the reference bias current and a switching control signal. The switching control circuit is configured to generate the switching control signal based on the bias voltage and the oscillation signal. A frequency of the oscillation signal is varied based on a magnitude of the bias voltage.

The current bias circuit may include a current mirror source, connected to a power voltage terminal, including a first PMOS and a second PMOS connected in a current mirror structure, that may be configured to generate the reference bias current, and a self-bias circuit, connected to the current mirror source, that may include a first NMOS and a second NMOS having a gate-common connection, and a bias resistor connected between a source of the first NMOS and a ground.

The oscillation signal generator circuit may include an output current mirror and a charging and discharging circuit. The output current mirror, including an output PMOS connected to the current bias circuit in a current mirror structure, may be configured to generate a second bias current based on the reference bias current. The charging and discharging circuit, including a capacitor connected between the output PMOS and a ground, may be configured to perform charging and discharging based on a second bias current flowing through the output PMOS. The switching device, connected in parallel to the capacitor, may be configured to generate the oscillation signal by performing a switching operation in response to the switching control signal of the switching control circuit.

The switching control circuit may include a comparison circuit that may be configured to compare the bias voltage with the oscillation signal and output a comparison signal having a level based on a result of the comparison, and a discharging logic circuit that may be configured to generate the switching control signal having a constant discharging time based on the comparison signal from the comparison circuit.

The bias voltage variable circuit may include a variable resistor circuit that may be configured to receive the first bias current from the first current mirror and have a resistance value varied based on the voltage control signal. The variable resistor circuit may generate the bias voltage determined based on the first bias current and the resistance value.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
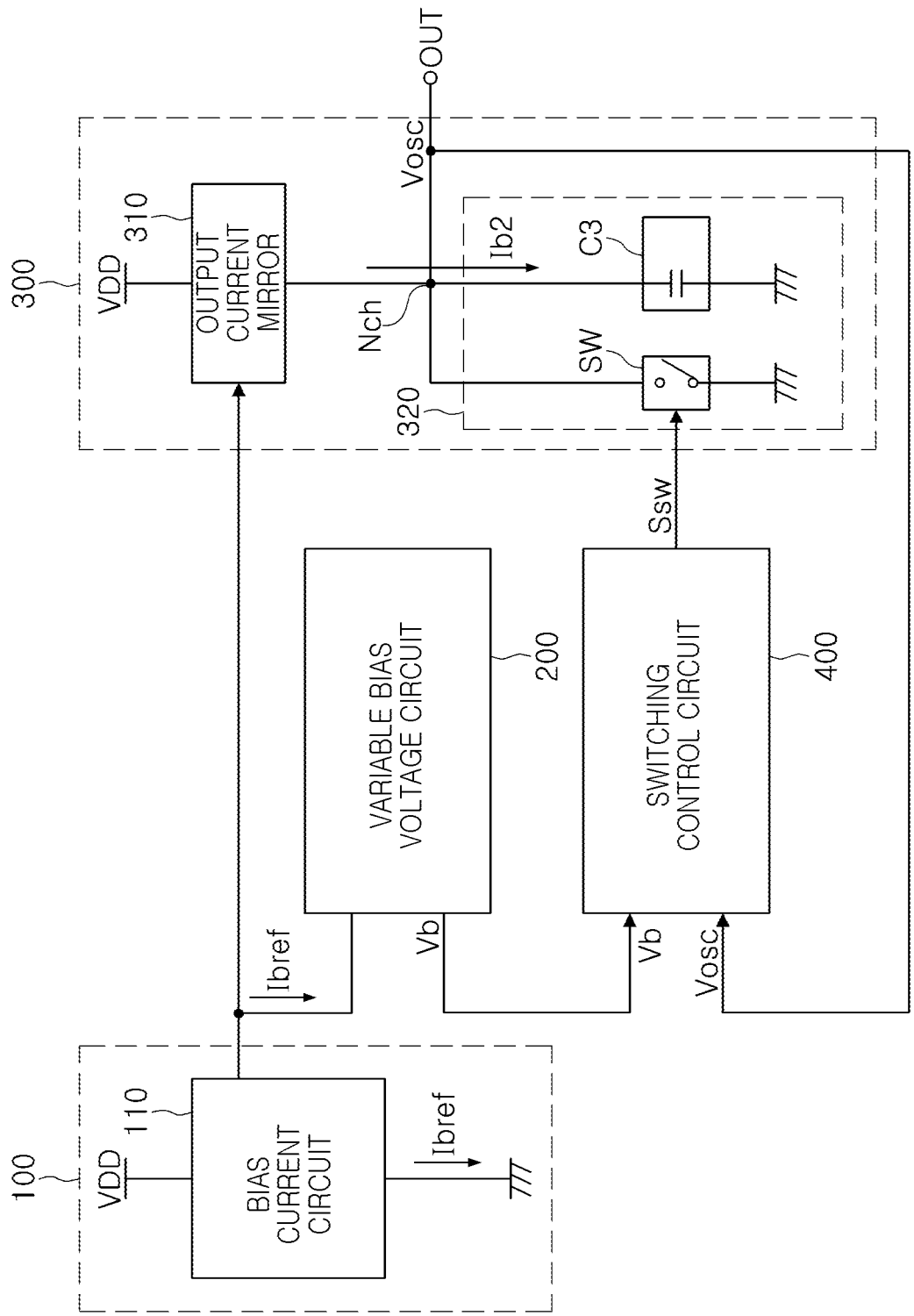
FIG. 1 is a diagram illustrating an example of a tunable oscillator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
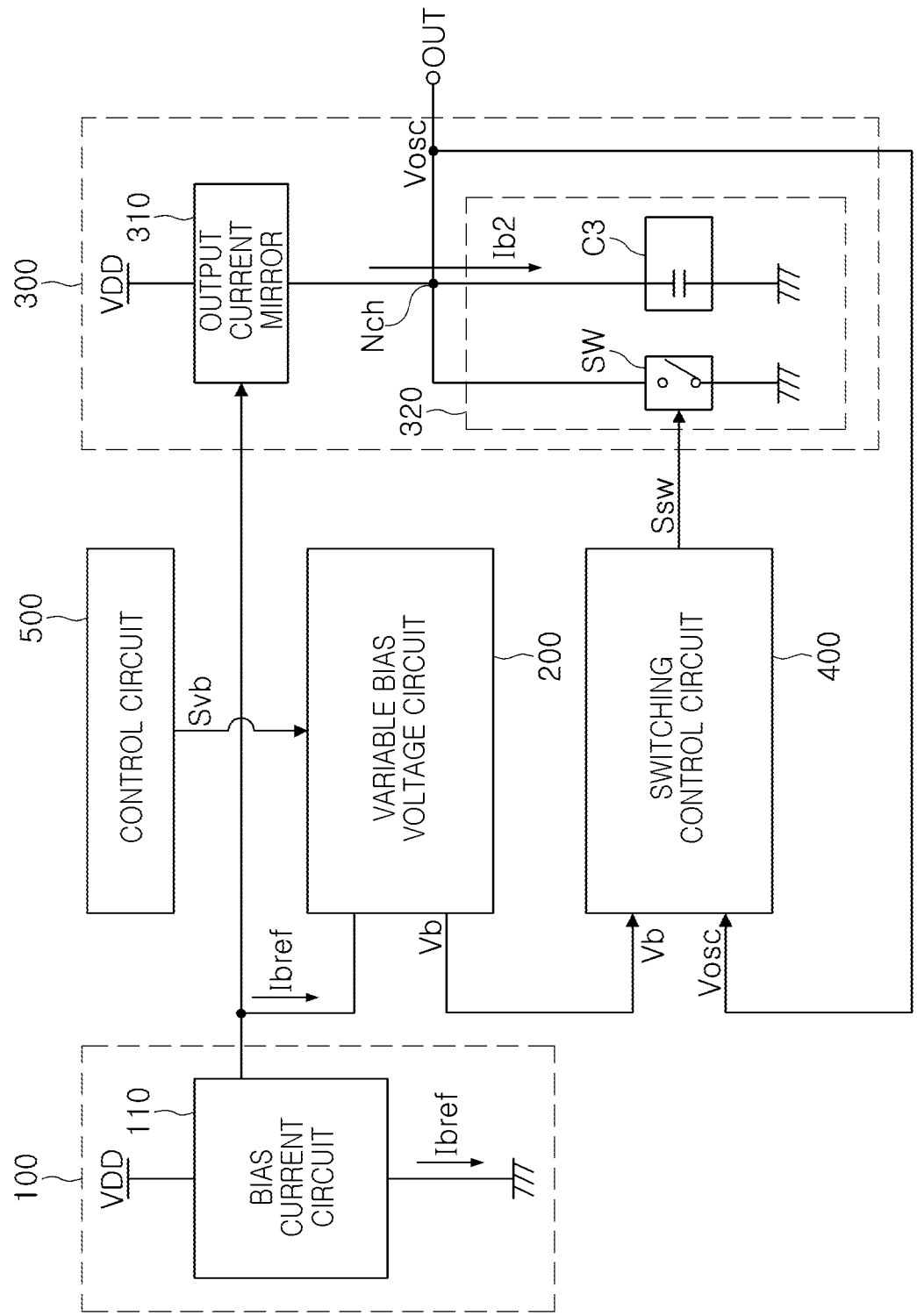
FIG. 2 is a diagram illustrating another example of a tunable oscillator.

FIG. 1 is a diagram illustrating an example of a tunable oscillator. FIG. 2 is a diagram illustrating another example of a tunable oscillator.

In FIG. 1, a tunable oscillator in the example embodiment may include a current bias circuit 100, a variable voltage bias circuit 200, an oscillation signal generator circuit 300, and a switching control circuit 400.

In FIG. 2, a tunable oscillator in the example embodiment may include a current bias circuit 100, a variable voltage bias circuit 200, an oscillation signal generator circuit 300, a switching control circuit 400, and a control circuit 500.

In FIGS. 1 and 2, the current bias circuit 100 may generate a reference bias current Ib_ref.

The variable voltage bias circuit 200 may receive the reference bias current Ib_ref and may generate a bias voltage Vb varied and determined according to the voltage control signal Svb.

The oscillation signal generator circuit 300 may generate an oscillation signal Vosc according to the reference bias current Ib_ref and the switching control signal Ssw.

As an example, the oscillation signal generator circuit 300 may output the oscillation signal Vosc generated by performing charging and discharging according to the reference bias current Ib_ref and the switching control signal Ssw through an output terminal OUT. For example, the oscillation signal generator circuit 300 may include an output current mirror 310 and a charging and discharging circuit 320. The output current mirror 310 may be connected between a power voltage VDD terminal and a charging node Nch, and the charging and discharging circuit 320 may be connected between the charging node Nch and a ground.

The present configuration will be described in greater detail with reference to FIGS. 3 and 4.

For example, a frequency of the oscillation signal Vosc may be varied according to a magnitude of the bias voltage Vb.

The switching control circuit 400 may generate the switching control signal Ssw based on the bias voltage Vb and the oscillation signal Vosc.

The overlapping descriptions of the elements having the same reference numeral and the same function will not be repeated, and differences therebetween will merely be described.

In FIG. 2, the control circuit 500 may provide the voltage control signal Svb. For example, the control circuit 500 may provide the voltage control signal Svb to generate an oscillation signal having a frequency according to a user's selection.

Figure 3:
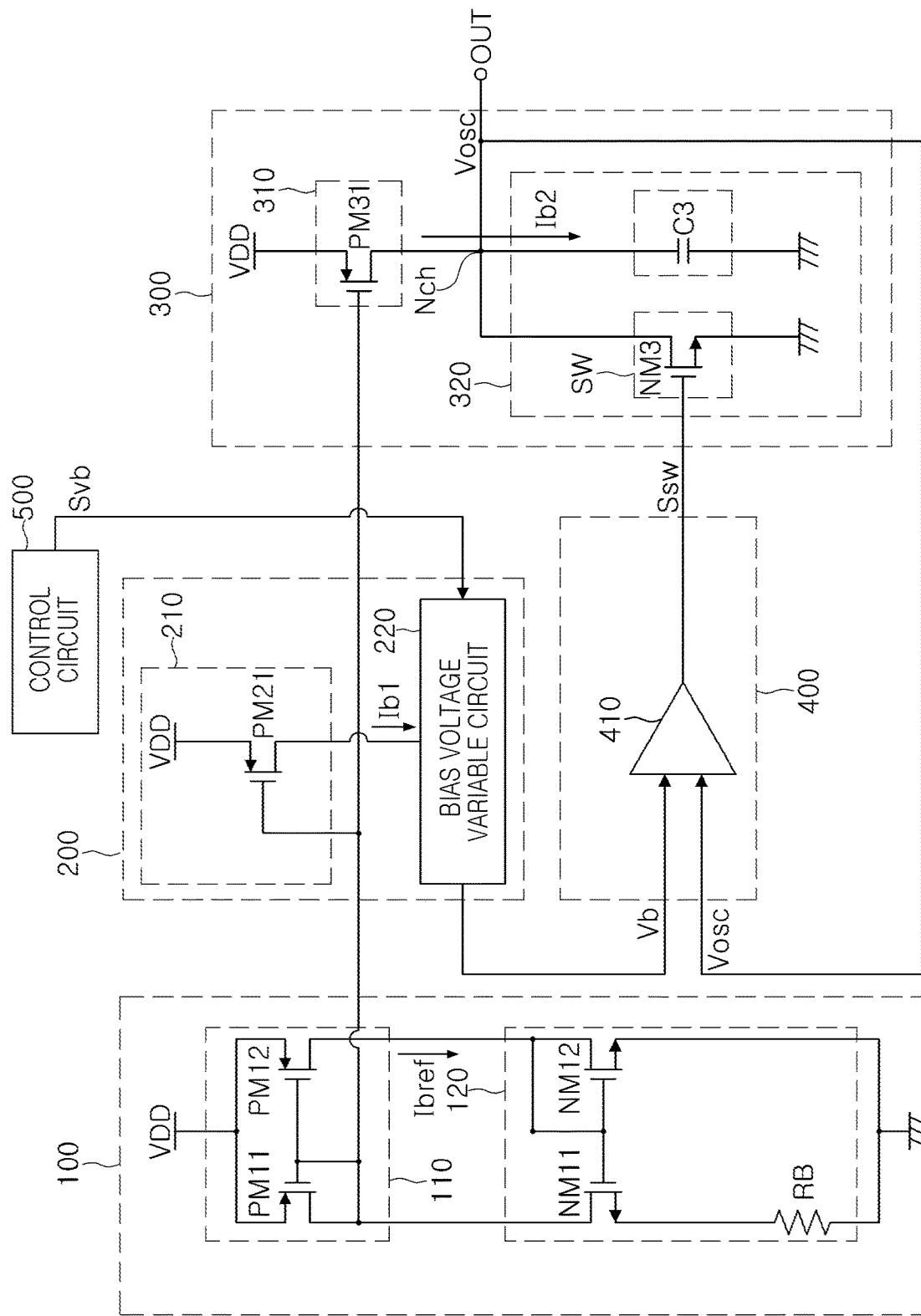
FIG. 3 is a diagram illustrating an example of a circuit of a tunable oscillator.

FIG. 3 is a diagram illustrating an example of a circuit of a tunable oscillator. FIG. 4 is a diagram illustrating an example of a circuit of a tunable oscillator.

Figure 4:
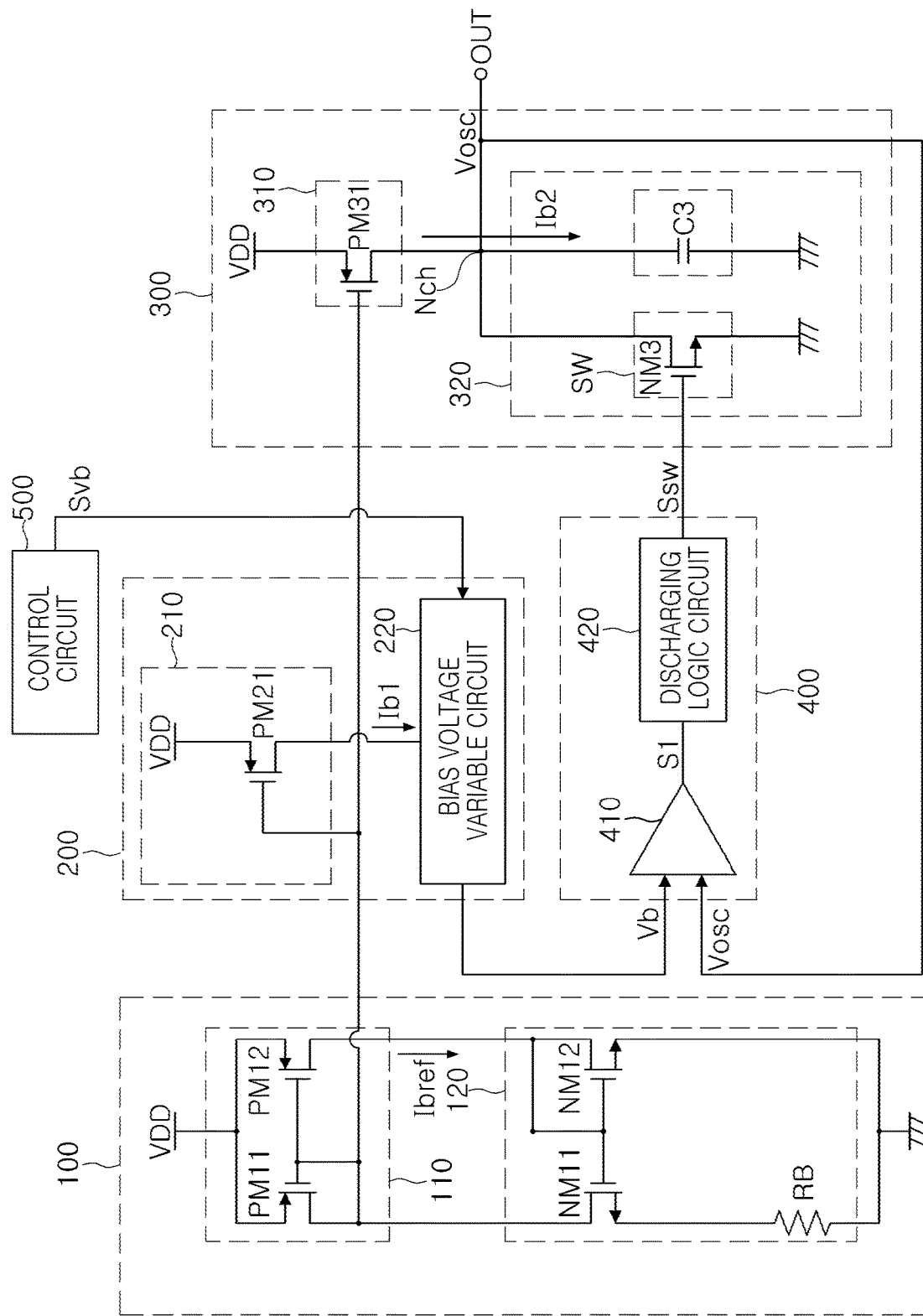
FIG. 4 is a diagram illustrating an example of a circuit of a tunable oscillator.

In FIGS. 3 and 4, the current bias circuit 100 may include a current mirror source 110 and a self-bias circuit 120.

The current mirror source 110 may include a first PMOS PM11 and a second PMOS PM12 connected to the power voltage VDD terminal and connected in a current mirror structure, and may generate the reference bias current Ib_ref. For example, the reference bias current Ib_ref may be determined according to a ratio between sizes of the first PMOS PM11 and the second PMOS PM12.

For example, when the current flowing through the first PMOS PM11 is the reference bias current Ib_ref, and a ratio between sizes of the first PMOS PM11 and the second PMOS (PM12) is 1:1, the current flowing through the second PMOS PM12 may become the reference bias current Ib_ref.

The self-bias circuit 120 may include a first NMOS NM11 and a second NMOS NM12 connected to the current mirror source 110 and having a gate-common connection, and a bias resistor RB connected between a source of the first NMOS NM11 and a ground. The gate and drain of the second NMOS NM12 are connected.

The variable voltage bias circuit 200 may include a first current mirror 210 and a bias voltage variable circuit 220.

The first current mirror 210 may include a detection PMOS PM21 connected to the power voltage VDD terminal and connected to the current bias circuit 100 in a current mirror structure, such that the first current mirror 210 may generate the first bias current Ib1 based on the reference bias current Ib_ref.

The bias voltage variable circuit 220 may receive the first bias current Ib1 from the first current mirror 210, and may generate the bias voltage Vb varied according to the voltage control signal Svb.

As an example, the first bias current Ib1 may be equal to m (m is a natural number equal to or greater than 1) times the reference bias current Ib_ref, and the magnitude of m may be determined according to the ratio between the sizes of the first PMOS PM11 and the detection PMOS PM21.

The oscillation signal generator circuit 300 may include an output current mirror 310 and a charging and discharging circuit 320.

The output current mirror 310 may include an output PMOS PM31 connected to the power voltage VDD terminal and connected to the current bias circuit 100 in a current mirror structure, and may generate the second bias current Ib2 based on the reference bias current Ib_ref.

As an example, the second bias current Ib2 may be equal to n (n is a natural number equal to or greater than 1) times the reference bias current Ib_ref, and the magnitude of n may be determined according to the ratio between the sizes of the first PMOS PM11 and the output PMOS PM31.

The charging and discharging circuit 320 may include a capacitor C3 and a switching device SW.

The capacitor C3 may be connected between the output PMOS PM31 and a ground, and may perform charging and discharging based on the second bias current Ib2 flowing through the output PMOS PM31.

For example, when the switching device SW is turned off, the capacitor C3 may perform a charging operation, and when the switching device SW is turned on, the capacitor C3 may perform a discharging operation.

The switching device SW may be connected to the capacitor C3 in parallel, and may perform the switching operation in response to the switching control signal Ssw and may generate the oscillation signal Sosc by performing the charging and discharging. As an example, the switch device SW may include an NMOS NM3.

The switching control circuit 400 may include a comparison circuit 410 and a discharging logic circuit 420.

The comparison circuit 410 may compare the bias voltage Vb with the oscillation signal Vosc and may output a comparison signal S1 having a level according to a result of the comparison.

The discharge logic circuit 420 may generate the switching control signal Ssw having a constant discharging time based on the comparison signal S1 from the comparison circuit 410.

Figure 5:
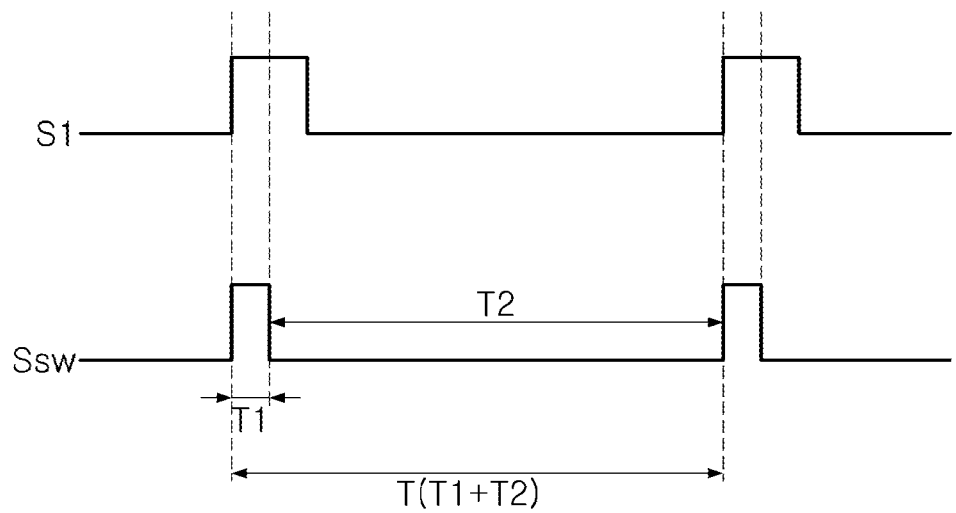
FIG. 5 is a diagram illustrating an example of timing of a main signal of a switching control circuit.

FIG. 5 is a diagram illustrating an example of timing of a main signal of a switching control circuit.

In FIG. 5, the element S1 may be a comparison signal output from the comparison circuit 410 of the switching control circuit 400, and the element Ssw may be a switching control signal output from the discharging logic circuit 420.

In FIG. 5, the comparison signal S1 may include a high-level time T1 and a low-level time T2, which may not be constant during a single period T. Differently from the comparison signal S1, the switching control signal Ssw may include a constant high-level time T1 and a constant low-level time T2, such that the switching control signal Ssw may have a uniform width for a stable oscillation operation.

Figure 6:
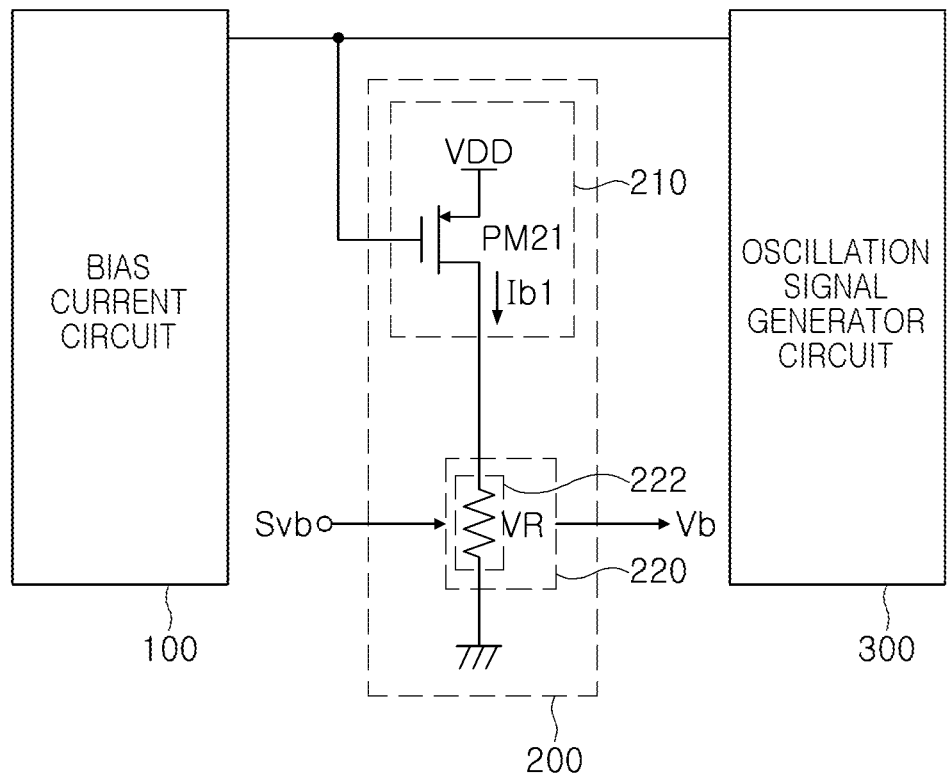
FIG. 6 is a diagram illustrating an example of a bias voltage variable circuit.

FIG. 6 is a diagram illustrating an example of a bias voltage variable circuit.

In FIG. 6, the bias voltage variable circuit 220 may include a variable resistor circuit 222.

The variable resistor circuit 222 may include a variable resistor VR receiving the first bias current Ib1 from the first current mirror 210 and having a resistance value varied according to the voltage control signal Svb.

For example, the variable resistor circuit 222 may generate the bias voltage Vb determined according to the first bias current Ib1 and a resistance value of the variable resistor VR.

Figure 7:
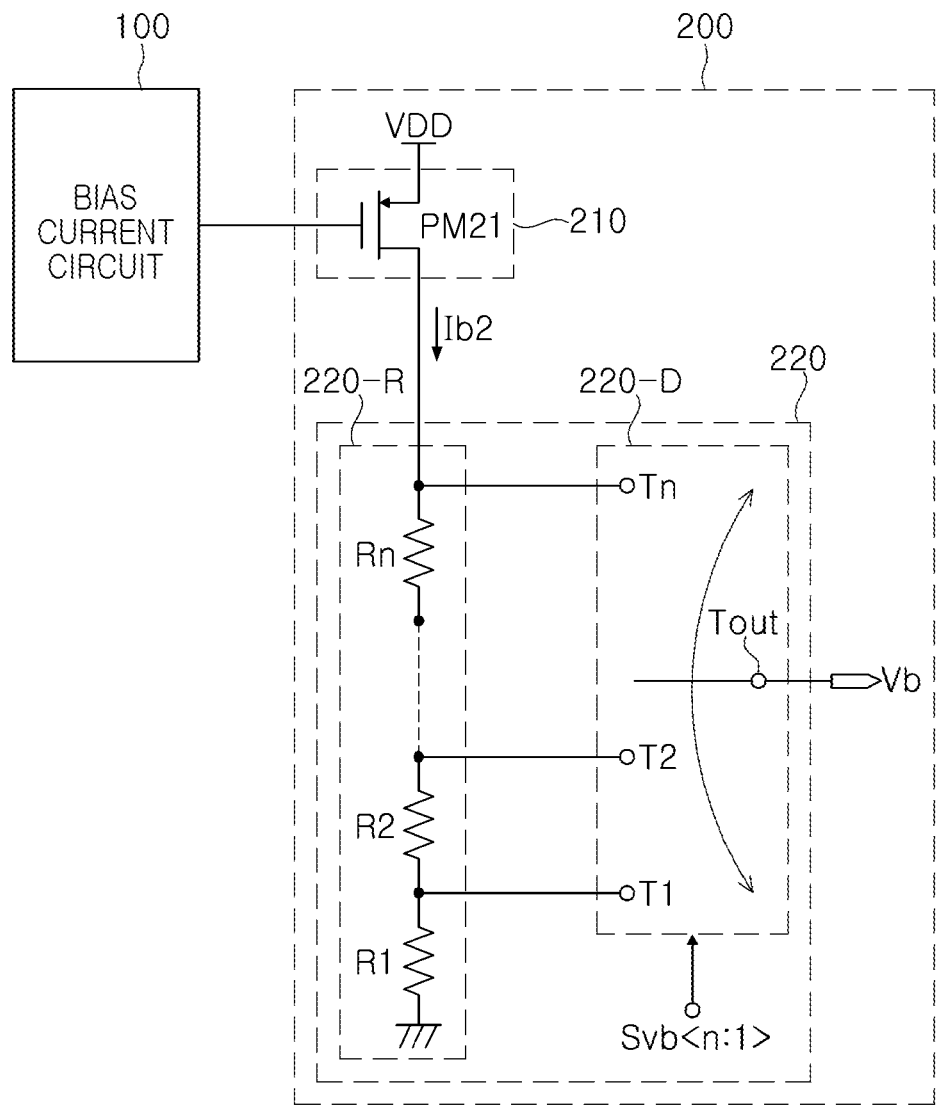
FIG. 7 is a diagram illustrating another example of a bias voltage variable circuit.

FIG. 7 is a diagram illustrating another example of a bias voltage variable circuit.

In FIG. 7, the bias voltage variable circuit 220 may include a resistor circuit 220-R and a decoder 220-D.

The resistor circuit 220-R may include a plurality of resistors R1, R2 to Rn connected in series between the output terminal of the first current mirror 210 and a ground, and may output a plurality of voltages V1, V2 to Vn at one ends of the plurality of resistors R1, R2 to Rn.

As an example, the plurality of voltages V1, V2, . . . , Vn determined by the plurality of resistors R1, R2 to Rn and the first bias current Ib1 may be supplied.

The decoder 220-D may output a voltage selected from among the plurality of voltages V1, V2 to Vn from the resistor circuit 220-R, selected according to an n-bit voltage control signal (Svb<n:1>), as the bias voltage Vb.

As an example, the decoder 220-D may include a switch block, and may connect one of a plurality of voltage terminals T1, T2, . . . , Tn to a common output terminal Tout, and may select and output one voltage.

As an example, when the resistor circuit 220-R includes three resistors, first, second, and third resistors R1, R2, and R3, connected in series between the output terminal of the first current mirror 210 and a ground. The resistor circuit 220-R may output the first, second, and third voltages V1, V2, and V3 at one ends of the first, second, and third resistors R1, R2, and R3, respectively. The first, second, and third voltages V1, V2, and V3 may be output through the first, second, and third voltage terminals T1, T2, and T3, respectively. When the control signal Svb is a 2-bit signal, the decoder 220-D may select one of the three voltage terminals T1, T2, and T3 using a 2-bit control signal.

For example, when the 2-bit control signal is <01>, the first voltage terminal T1 may be selected and the first voltage V1 may be output through the common output terminal Tout, and when the 2-bit control signal is <10>, the second voltage terminal T2 may be selected and the second voltage V2 may be output through the common output terminal Tout. When the 2-bit control signal is <11>, the third voltage terminal T3 may be selected and the third voltage V3 may be output through the common output terminal Tout.

Thus, the bias voltage may be varied by selecting one voltage from among the three or more voltages and outputting the one voltage.

In FIGS. 1 to 7, a period T of the oscillation signal Sosc may be determined as a product (R×C) of the resistance value R selected by the bias voltage variable circuit 220 and the capacitance C of the capacitor C3 of the charging and discharging circuit 320.

In other words, the entire charge Q charged in the capacitor C3 of the charging and discharging circuit 320 may be a product of the capacitance C and the voltage Vosc of the oscillation signal Sosc, and may be expressed as in Equation 1 below.

Also, the second bias current Ib2 flowing to the capacitor C5 of the charging and discharging circuit 320 may be expressed as in Equation 2 below.

$$Q = C \times Vosc \qquad \text{[Equation 1]}$$

$$Ib2 = Q/(T1+T2) \approx (C \times Vosc)/T1 \text{ (if } T1 \gg T2, T \approx T1\text{), in other words, } T1 \approx (C \times Vosc)/Ib2 \qquad \text{[Equation 2]}$$

In Equations 1 and 2, the period T illustrated in FIG. 3 is "T1+T2," where T1 is larger than T2 (T1≫T2). Thus, when T2 is not considered, the period T may be almost equal to T1.

When Equation 2 is expressed as a function independent of temperature, instead of voltage and current, Equation 2 may be expressed as in Equation 3.

$$T1 = (C \times Vosc)/Ib2 = [C \times (Ib2 \times R)]/[Ib2] = C \times R \qquad \text{[Equation 3]}$$

In Equation 3, C is capacitance of the capacitor C3, and R is a resistance value of the charging and discharging circuit 320.

In Equation 3, the period T (=T1) may be expressed as a product of the capacitance C of the capacitor C3 and the resistance value R of the charging and discharging circuit 320, where the period T may be determined by a constant term independent of temperature. Therefore, in the oscillation circuit in the example embodiment, the period, a frequency function, which may independent of power voltage and temperature, may be implemented.

Figure 8:
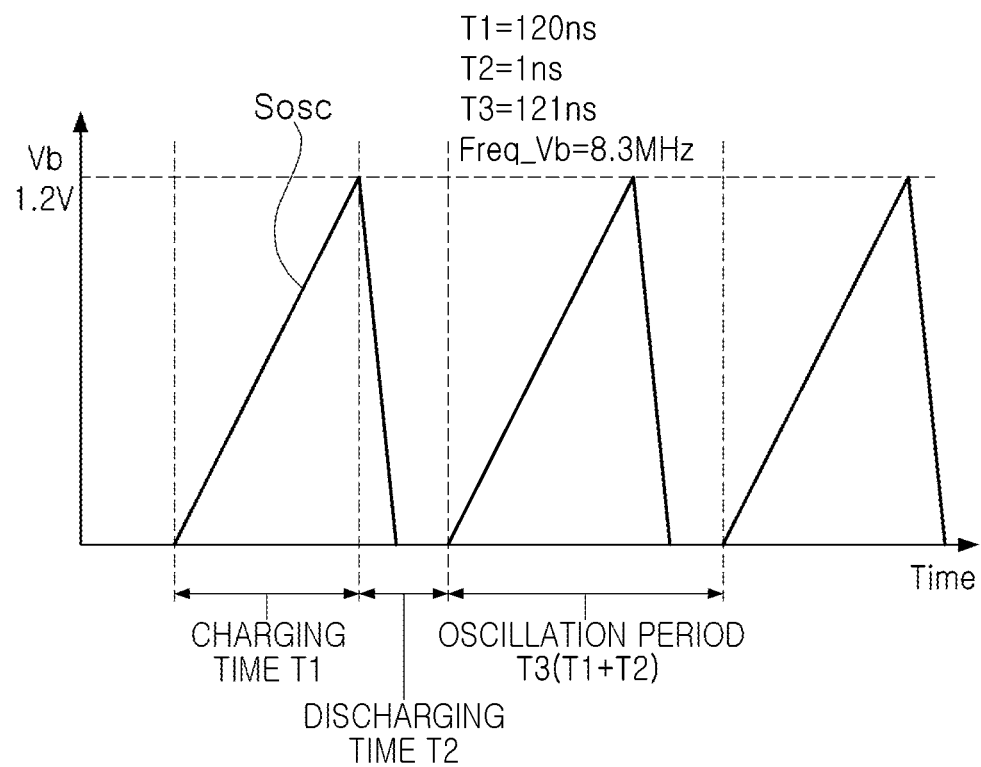
FIG. 8 is a diagram illustrating an example of an oscillation signal according to a bias voltage of 1.2V.
Figure 9:
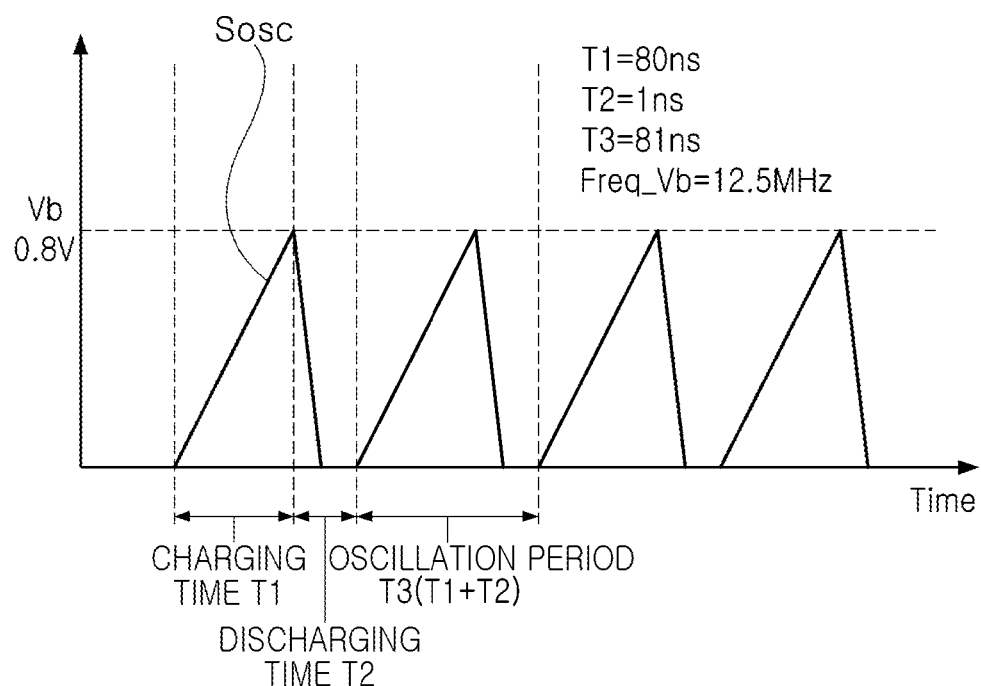
FIG. 9 is a diagram illustrating an example of an oscillation signal according to a bias voltage of 0.8V.
Figure 10:
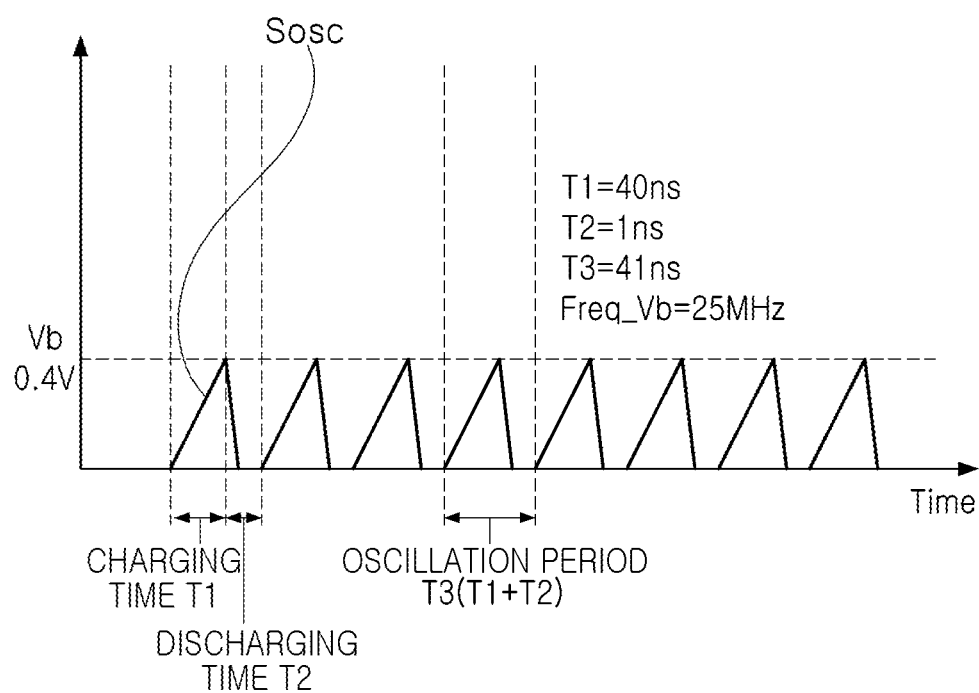
FIG. 10 is a diagram illustrating an example of an oscillation signal according to a bias voltage of 0.4V.

FIG. 8 is a diagram illustrating an example of an oscillation signal according to a bias voltage of 1.2V. FIG. 9 is a diagram illustrating an example of an oscillation signal according to a bias voltage of 0.8V. FIG. 10 is a diagram illustrating an example of an oscillation signal according to a bias voltage of 0.4V.

FIGS. 8, 9, and 10 illustrate an example of the oscillation signal in which, when the bias voltage (Vb) is 1.2V, 0.8V, and 0.4V, respectively, an oscillation signal Sosc having a frequency of 8.3 MHz, 12.5 MHz, and 25 MHz, respectively, may be generated.

FIGS. 8, 9, and 10 also illustrate a result of simulation of when the second bias current Ib2 input to the charging and discharging circuit 320 is 100 μA, and the capacitance of the capacitor C3 of the charging and discharging circuit 320 is 10 pF.

Also, since T2 is usually 1 nsec, when T2 is not considered as T2 is less than T1, T3 may be determined by T1.

The control circuit of the tunable oscillator in the example embodiment may be implemented in a computing environment in which a processor (e.g., a central processing unit (CPU), a graphics processing unit (GPU), a microprocessor, an application specific integrated circuit (ASIC), field programmable gate arrays (FPGA), or the like), a memory (e.g., a volatile memory (e.g., a RAM, or the like), a non-volatile memory (e.g. a ROM, a flash memory, or the like), an input device (e.g., a keyboard, a mouse, a pen, a voice input device, a touch input device, an infrared camera, a video input device, or the like), an output device (e.g., a display, a speaker, a printer, or the like) and a communication connection device (e.g., a modem, a network interface card (NIC), an integrated network interface, a wireless frequency transmitter/receiver, an infrared port, a USB connection device, or the like) are connected (e.g., peripheral component interconnection (PCI), USB, firmware (IEEE 1394), optical bus structure, network, or the like) to one another.

The computing environment may be implemented as a distributed computing environment including a personal computer, a server computer, a handheld or laptop device, a mobile device (a mobile phone, a PDA, a media player, or the like), a multiprocessor system, a consumer electronic device, a mini computer, a mainframe computer, and a random system or device described above, but an example embodiment thereof is not limited thereto.

According to the aforementioned example embodiments, by including the function of compensating temperature and power voltage without a band gap reference circuit, a stable oscillation signal may be generated regardless of temperature changes and power voltage changes, such that noise properties may be addressed. Also, by adjusting the magnitude of a bias voltage through an analog method or a digital method without adding a frequency variable circuit, the oscillation frequency may be stably varied.

Accordingly, a size of the oscillator may be reduced, material cost may be lowered and complexity of the manufacturing process may be reduced such that mass production may improve.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A tunable oscillator, comprising:

a current bias circuit configured to generate a reference bias current;

a variable voltage bias circuit configured to receive the reference bias current and generate a bias voltage varied based on a voltage control signal;

an oscillation signal generator circuit configured to generate an oscillation signal based on the reference bias current and a switching control signal; and a switching control circuit configured to generate the switching control signal based on the bias voltage and the oscillation signal, wherein a frequency of the oscillation signal is varied based on a magnitude of the bias voltage, and the switching control signal has a uniform width.

2. The tunable oscillator of claim 1, wherein the current bias circuit includes:

a current mirror source, connected to a power voltage terminal, including a first PMOS and a second PMOS connected in a current mirror structure, and configured to generate the reference bias current; and a self-bias circuit, connected to the current mirror source, including a first NMOS and a second NMOS having a gate-common connection, and a bias resistor connected between a source of the first NMOS and a ground.

3. The tunable oscillator of claim 1, wherein the variable voltage bias circuit includes:

a first current mirror, including a detection PMOS connected to the current bias circuit in a current mirror structure, configured to generate a first bias current based on the reference bias current; and a bias voltage variable circuit configured to receive the first bias current from the first current mirror and generate the bias voltage varied based on the voltage control signal.

4. The tunable oscillator of claim 1, wherein the oscillation signal generator circuit includes:

an output current mirror, including an output PMOS connected to the current bias circuit in a current mirror structure, configured to generate a second bias current based on the reference bias current; and a charging and discharging circuit, including a capacitor connected between the output PMOS and a ground, configured to perform charging and discharging based on a second bias current flowing through the output PMOS, and a switching device, connected in parallel to the capacitor, configured to generate the oscillation signal by performing a switching operation in response to the switching control signal of the switching control circuit.

5. The tunable oscillator of claim 1, wherein the switching control circuit includes:

a comparison circuit configured to compare the bias voltage with the oscillation signal and output a comparison signal having a level based on a result of the comparison; and a discharging logic circuit configured to generate the switching control signal having a constant discharging time based on the comparison signal from the comparison circuit.

6. The tunable oscillator of claim 3, wherein the bias voltage variable circuit includes a variable resistor circuit configured to receive the first bias current from the first current mirror and have a resistance value varied based on the voltage control signal, and wherein the variable resistor circuit generates the bias voltage determined based on the first bias current and the resistance value.

7. The tunable oscillator of claim 3, wherein the bias voltage variable circuit includes:

a resistor circuit, including a plurality of resistors connected in series between an output terminal of the first current mirror and a ground, configured to output a plurality of voltages at one end of the plurality of resistors; and a decoder configured to output a voltage selected from among a plurality of voltages from the resistor circuit, selected based on the voltage control signal, as the bias voltage.

8. A tunable oscillator, comprising:

a current bias circuit configured to generate a reference bias current;

a variable voltage bias circuit configured to receive the reference bias current and generate a bias voltage varied and determined based on a voltage control signal;

an oscillation signal generator circuit configured to generate an oscillation signal by performing charging and discharging based on the reference bias current and a switching control signal;

a switching control circuit configured to generate the switching control signal based on the bias voltage and the oscillation signal; and a control circuit configured to provide the voltage control signal, and the switching control signal has a uniform width.

9. The tunable oscillator of claim 8, wherein a frequency of the oscillation signal is varied based on the magnitude of the bias voltage.

10. The tunable oscillator of claim 8, wherein the current bias circuit includes:

a current mirror source, connected to a power voltage terminal, including a first PMOS and a second PMOS connected in a current mirror structure, and configured to generate the reference bias current; and a self-bias circuit connected to the current mirror source and including a first NMOS and a second NMOS having a gate-common connection, and a bias resistor connected between a source of the first NMOS and a ground.

11. The tunable oscillator of claim 8, wherein the variable voltage bias circuit includes:

a first current mirror, including a detection PMOS connected to the current bias circuit in a current mirror structure, and configured to generate a first bias current based on the reference bias current; and a bias voltage variable circuit configured to receive the first bias current from the first current mirror and generate the bias voltage varied based on the voltage control signal.

12. The tunable oscillator of claim 8, wherein the oscillation signal generator circuit includes:

an output current mirror, including an output PMOS connected to the current bias circuit in a current mirror structure, configured to generate a second bias current based on the reference bias current; and a charging and discharging circuit, including a capacitor connected between the output PMOS and a ground, configured to perform charging and discharging based on a second bias current flowing through the output PMOS, and a switching device, connected in parallel to the capacitor, configured to generate the oscillation signal by performing a switching operation in response to the switching control signal of the switching control circuit.

13. The tunable oscillator of claim 8, wherein the switching control circuit includes:
a comparison circuit configured to compare the bias voltage with the oscillation signal and output a comparison signal having a level based on a result of the comparison; and
a discharging logic circuit configured to generate the switching control signal having a constant discharging time based on the comparison signal from the comparison circuit.

14. The tunable oscillator of claim 11,
wherein the bias voltage variable circuit includes a variable resistor circuit configured to receive the first bias current from the first current mirror and have a resistance value varied based on the voltage control signal, and
wherein the variable resistor circuit generates the bias voltage determined based on the first bias current and the resistance value.

15. The tunable oscillator of claim 11, wherein the bias voltage variable circuit includes:
a resistor circuit, including a plurality of resistors connected in series between an output terminal of the first current mirror and a ground, and configured to output a plurality of voltages at one end of the plurality of resistors; and
a decoder outputting a voltage selected from among a plurality of voltages from the resistor circuit, selected based on the voltage control signal, as the bias voltage.

16. An oscillator, comprising:
a current bias circuit configured to generate a reference bias current;
a variable voltage bias circuit, comprising
a first current mirror, connected to the current bias circuit in a current mirror structure, configured to generate a first bias current based on the reference bias current, and
a bias voltage variable circuit configured to receive the first bias current, and generate a bias voltage varied based on a voltage control signal;
an oscillation signal generator circuit configured to generate an oscillation signal based on the reference bias current and a switching control signal; and
a switching control circuit configured to generate the switching control signal based on the bias voltage and the oscillation signal,
wherein a frequency of the oscillation signal is varied based on a magnitude of the bias voltage, and the switching control signal has a uniform width.

17. The oscillator of claim 16, wherein the current bias circuit comprises:
a current mirror source, connected to a power voltage terminal, including a first PMOS and a second PMOS connected in a current mirror structure, and configured to generate the reference bias current; and
a self-bias circuit, connected to the current mirror source, including a first NMOS and a second NMOS having a gate-common connection, and a bias resistor connected between a source of the first NMOS and a ground.

18. The oscillator of claim 16, wherein the oscillation signal generator circuit comprises:
an output current mirror, including an output PMOS connected to the current bias circuit in a current mirror structure, configured to generate a second bias current based on the reference bias current; and
a charging and discharging circuit, including a capacitor connected between the output PMOS and a ground, configured to perform charging and discharging based on a second bias current flowing through the output PMOS, and
a switching device, connected in parallel to the capacitor, configured to generate the oscillation signal by performing a switching operation in response to the switching control signal of the switching control circuit.

19. The oscillator of claim 16, wherein the switching control circuit comprises:
a comparison circuit configured to compare the bias voltage with the oscillation signal and output a comparison signal having a level based on a result of the comparison; and
a discharging logic circuit configured to generate the switching control signal having a constant discharging time based on the comparison signal from the comparison circuit.

20. The oscillator of claim 16, wherein the bias voltage variable circuit comprises a variable resistor circuit configured to receive the first bias current from the first current mirror and have a resistance value varied based on the voltage control signal, and
wherein the variable resistor circuit generates the bias voltage determined based on the first bias current and the resistance value.

* * * * *